(12) United States Patent  
Ku et al.

(10) Patent No.: US 8,105,851 B1
(45) Date of Patent: Jan. 31, 2012

(54) NITRIDE FILM WET STRIPPING

(75) Inventors: Shao-Yen Ku, Jhubei (TW); Chung-Ru Yang, Chung-Ho (TW); Chi-Ming Yang, Hsian-San District (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/889,167

(22) Filed: Sep. 23, 2010

(51) Int. Cl.
    *H01L 21/66* (2006.01)
(52) U.S. Cl. ....... 438/8; 438/757; 216/84; 257/E21.521; 134/109
(58) Field of Classification Search ............... 438/5, 8, 438/747, 757; 216/84, 85, 86, 93; 257/E21.521, 257/E21.525, E21.529, E21.53; 156/345.15, 156/345.18, 345.24; 134/105, 109
See application file for complete search history.

(56) References Cited

U.S. PATENT DOCUMENTS

| | | | |
|---|---|---|---|
| 6,699,400 B1* | 3/2004 | Ballantine et al. | 216/90 |
| 7,763,548 B2* | 7/2010 | Palsulich et al. | 438/745 |
| 2009/0087929 A1* | 4/2009 | Yu et al. | 438/8 |

* cited by examiner

*Primary Examiner* — Julio J Maldonado
(74) *Attorney, Agent, or Firm* — Haynes and Boone, LLP

(57) ABSTRACT

Provided is a method of removing a nitride material from a semiconductor wafer. The method includes monitoring a silicon concentration level in a chemical solution. The chemical solution may include a phosphoric acid. The method includes adjusting the silicon concentration level in response to the monitoring. The method includes heating the chemical solution. The method includes applying the heated chemical solution to a wafer surface in a manner so that a temperature of the heated chemical solution is within a predefined temperature range throughout the wafer surface. The method includes etching a nitride material of the wafer using the heated chemical solution.

19 Claims, 3 Drawing Sheets

NITRIDE FILM WET STRIPPING

BACKGROUND

The semiconductor integrated circuit (IC) industry has experienced rapid growth in recent years. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has steadily decreased.

To achieve the needed functional density and geometry size, modern semiconductor fabrication may involve a plurality of fabrication processes. For example, a nitride etching fabrication process may need to be performed to remove a nitride material from a semiconductor wafer. However, traditional nitride etching techniques tend to damage the wafer surface, particularly if the nitride etching needs to occur after gate pattern formation, since the removal of the nitride material cannot be done using physical force at that point. In addition, the traditional nitride etching techniques may have poor etching uniformity and may not have a proper balance between etching selectivity and wafer surface defect reduction.

Therefore, while existing nitride removal methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
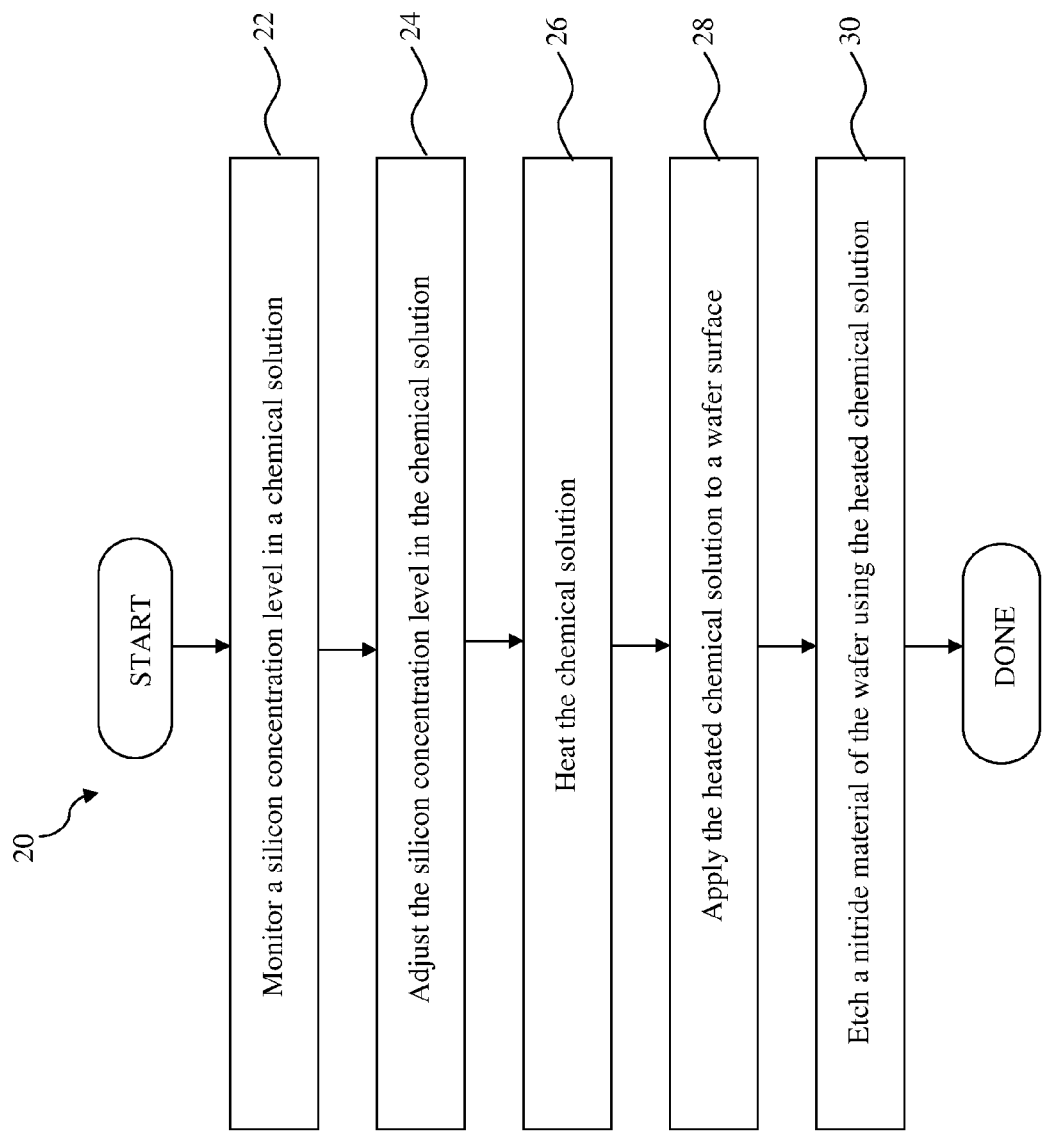
FIG. 1 is a flowchart illustrating a method for removing a nitride material from a wafer according to various aspects of the present disclosure.

Illustrated in FIG. 1 is a flowchart of a method 20 for removing a nitride material from a semiconductor wafer. The method 20 begins with block 22 in which a silicon concentration level in a chemical solution is monitored. The method 20 continues with block 24 in which the silicon concentration level is adjusted in response to the monitoring. The method 20 continues with block 26 in which the chemical solution is heated. The method 20 continues with block 28 in which the heated chemical solution is applied to a wafer surface. The application of the heated chemical is carried out in a manner so that a temperature of the heated chemical solution is within a predefined temperature range throughout the wafer surface. The method 20 continues with block 30 in which a nitride material of the wafer is etched using the heated chemical solution.

To remove a nitride material, for example a silicon nitride material ($Si_3N_4$), the present embodiment uses a chemical solution that contains phosphoric acid ($H_3PO_4$). The chemical solution may also contain water. The chemical solution is heated and then spin-coated on a wafer surface. The phosphoric acid of the chemical solution will react with the silicon nitride material on the wafer surface and produce a silicic acid ($Si(OH)_4$). The silicic acid may turn into a silica precipitate when it is dehydrated or dried. As an example, the chemical reaction may have the following chemical equation:

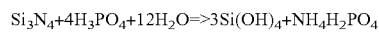

$$Si_3N_4 + 4H_3PO_4 + 12H_2O \Rightarrow 3Si(OH)_4 + NH_4H_2PO_4$$

As the above equation shows, the silicic acid is one product term of the chemical reaction. The other product term $NH_4H_2PO_4$ can be further broken down into an ammonia gas ($NH_3$) component and a phosphoric acid component ($H_3PO_4$). The ammonia gas component will evaporate away when it is heated, thereby leaving the phosphoric acid component. As such, the chemical process used to etch the silicon nitride material involves applying phosphoric acid on the wafer, and the chemical reaction removes the silicon nitride material and produces a silicic acid as well as phosphoric acid. In other words, the phosphoric acid appears on both sides of the chemical reaction equation.

It is desirable for the chemical solution to have good etching selectivity between a silicon nitride material and a silicon oxide material or a silicide material. Stated differently, it is desirable for the chemical solution to have a high etching rate with respect to the silicon nitride material, but to have a low etching rate with respect to the silicon oxide material or a silicide material. The etching selectivity is correlated to the concentration of the silicic acid, which can be measured in the form of a silicon concentration level in the chemical solution. A higher concentration level of the silicic acid (and thus a higher concentration of silicon) corresponds to a higher etching selectivity between the silicon nitride material and the silicon oxide material or the silicide material.

However, as discussed above, the silicic acid produces silica precipitate particles on the wafer surface when it is dried or dehydrated. The silica precipitate particles are undesired and may result in wafer surface defects. Thus, to reduce wafer surface defects, a smaller number of silica precipitate particles is desired, which means that the silicon concentration level (the silicic acid concentration level) in the chemical solution needs to be lowered.

Hence, a tradeoff exists between wafer surface defects and good etching selectivity, which means that the silicon concentration level in the chemical solution cannot be too high or too low. If the silicon concentration level is too high, the etching selectivity may be good, but the number of wafer surface defects may become unacceptably large. On the other hand, if the silicon concentration level is too low, the number of wafer surface defects may be substantially reduced, but the etching selectivity may become unacceptably poor. Therefore, the silicon concentration level in the chemical solution should be kept at an optimum and stable range.

Figure 2:
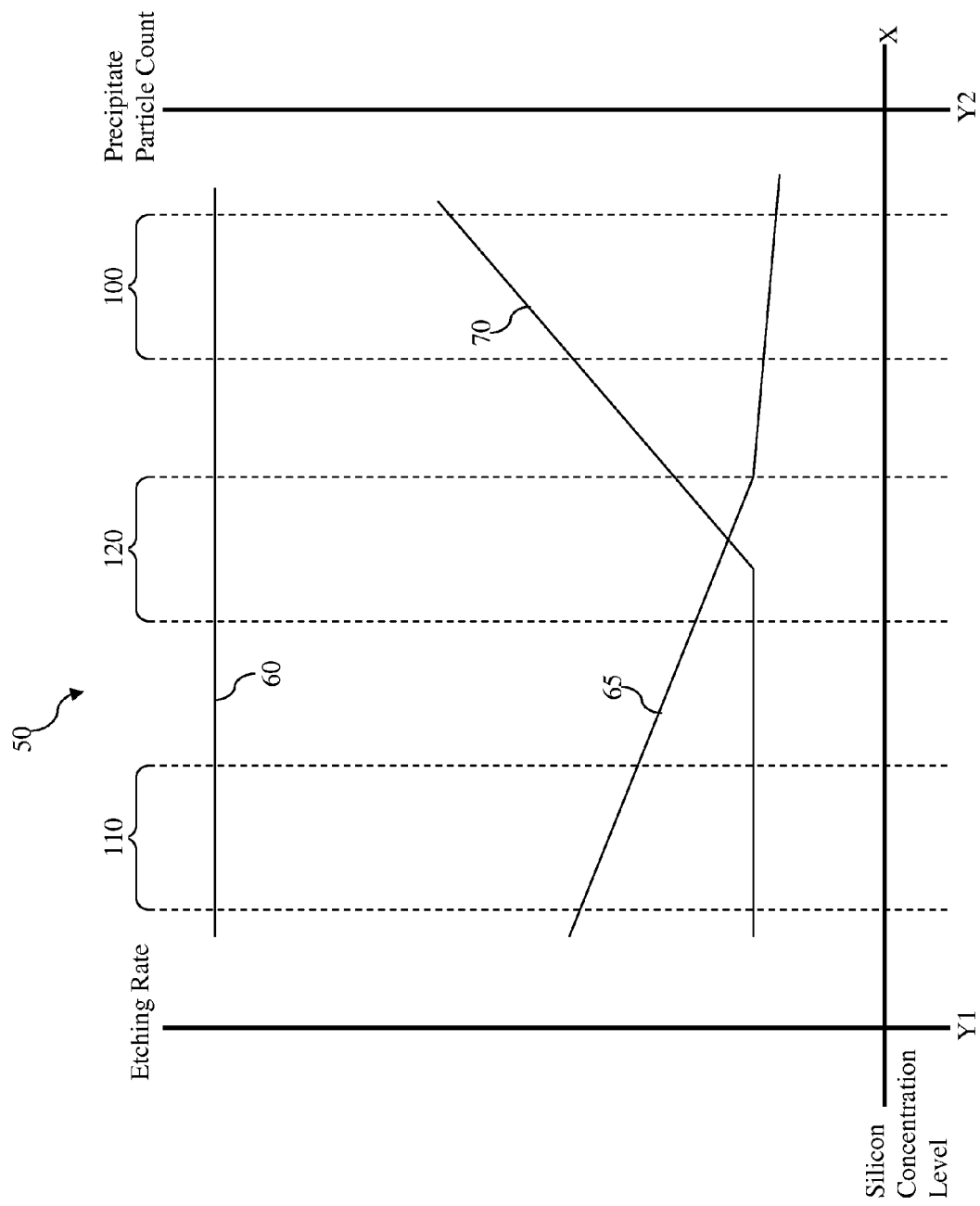
FIG. 2 is a graphical chart illustrating various tradeoffs between competing concerns associated with a nitride removal process according to various aspects of the present disclosure.

FIG. 2 is a graphical chart 50 illustrating the relationship and interaction discussed above between etching selectivity, a precipitate particle count (wafer defects), and a silicon concentration level in the chemical solution. The chart 50 includes an X-axis and two Y-axes, Y1 and Y2. The X-axis represents the silicon concentration levels in a chemical solution that contains phosphoric acid. The silicon concentration level has a measurement unit of parts-per-million (ppm). The Y1-axis represents an etching rate of a material (such as silicon nitride or silicide) when it reacts with the chemical solution. The Y1-axis has a measurement unit of Angstroms-per-minute. The Y2-axis represents a precipitate particle count on the wafer surface as a result of the nitride material being etched by the chemical solution. The Y2-axis has a measurement unit of particle-counts-per-milliliter. It is understood that the Y1 and Y2-axes are superimposed onto the same chart 50 for the sake of simplicity and clarity, and to facilitate the ensuing discussions.

Two curves 60 and 65 are plotted with respect to the X-axis and the Y1-axis, and a curve 70 is plotted with respect to the X-axis and the Y2-axis. In more detail, the curve 60 is an illustration of how the etching rate of silicon nitride varies with respect to the silicon concentration level in the chemical solution. The curve 65 is an illustration of how the etching rate of nickel silicide (NiSi) varies with respect to the silicon concentration level in the chemical solution. The curve 70 is an illustration of how the silica precipitate particle count varies with respect to the silicon concentration level in the chemical solution.

As shown by the curve 60, the etching rate of silicon nitride remains substantially flat in spite of the changes in the silicon concentration levels. In other words, the silicon concentration level in the chemical solution does not affect the etching rate of the silicon nitride material very much. In comparison, as shown by the curve 65, the etching rate of nickel silicide decreases as the silicon concentration level increases. Thus, as silicon concentration level increases, the difference between the etching rates of the silicon nitride material and the nickel silicide material increases as well. This means that the etching selectivity between silicon nitride and nickel silicide improves (becomes greater) as the silicon concentration level increases.

Meanwhile, as shown by the curve 70, the silica precipitate particle count increases along with the silicon concentration level in the chemical solution. Therefore, at a high silicon concentration level—for example in a region 100 of the chart 50—the etching selectivity may be good, but the silica precipitate particle count (and therefore wafer surface defects) becomes unacceptably high. On the other hand, at a low silicon concentration level—for example in a region 110 of the chart 50—the silica precipitate particle count may be reduced, but the etching selectivity becomes unacceptably low.

It is therefore desirable to maintain the silicon concentration level within a predetermined range, so that an optimal tradeoff between etching selectivity and precipitate particle count is achieved. An example of this predetermined range of silicon concentration level is shown as a region 120 in the chart 50. Within the region 120, the etching selectivity between silicon nitride and nickel silicide is high enough to be acceptable, while the precipitate particle count is also low enough to be acceptable.

Though FIG. 2 and the corresponding discussions above use silicon nitride and nickel silicide as examples, it is understood that the above concept may apply to other materials as well. For instance, instead of nickel silicide, the curve 65 may represent the variation of an etching rate of a silicon oxide material with respect to a silicon concentration level in the chemical solution. Further, it is understood that the regions 100, 110, and 120 are illustrated purely as examples, and that other regions with different ranges may be used to replace the regions 100, 110, and 120 instead.

As is shown by the chart 50 in FIG. 2, it is desirable to confine the silicon concentration level in the chemical solution to be within a predefined optimal range, so that a proper balance between etching selectivity and wafer surface defects can be achieved. Furthermore, the chemical solution is heated for etching performance reasons. However, in traditional methods, the chemical solution applied to different parts of a wafer surface may have temperatures that are too different from one another. This temperature difference would result in etching non-uniformity and is therefore undesirable.

Figure 3:
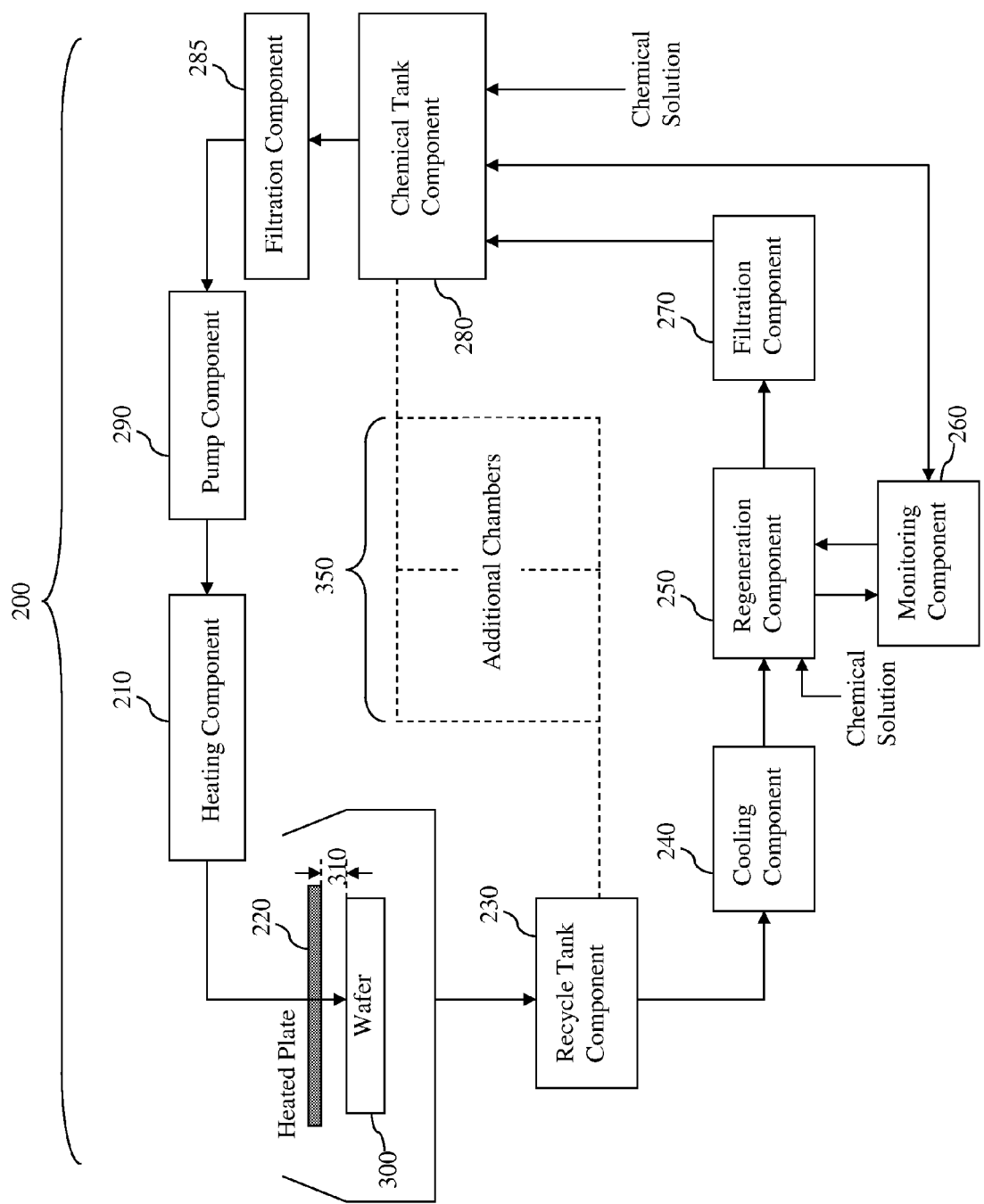
FIG. 3 is a simplified diagrammatic block diagram of a system used to carry out nitride removal from a wafer according to various aspects of the present disclosure.

To resolve the etching non-uniformity issue caused by temperature variation of the chemical solution, as well as to keep the silicon concentration level in the chemical solution to be within a proper and stable range, a system (or apparatus) is designed according to various aspects of the present disclosure. FIG. 3 shows a simplified block diagram of an embodiment of the system, designated with the reference numeral 200.

Referring to FIG. 3, the system 200 includes a heating component 210, a heated plate 220, a recycle tank component 230, a cooling component 240, a regeneration component 250, a monitoring component 260, a filtration component 270, a chemical tank component 280, another filtration component 285, and a pump component 290. The components 210-290 form a loop. A wafer 300 is placed within this loop to have its silicon nitride material removed through an etching process using the chemical solution that contains phosphoric acid.

In more detail, the heating component 210 heats up the chemical solution containing phosphoric acid. The heating component 210 has a dispensing component such as a nozzle, which can be used to apply the chemical solution onto a top surface of the wafer 300 through a spin coating process. In alternative embodiments, the dispensing component may be implemented separately from the heating component.

As discussed previously, the chemical solution may have better nitride removal performance when it is heated. To improve the heating uniformity of the chemical solution throughout the surface of the wafer 300, the heated plate (also referred to as a hot plate) 220 is placed in close proximity with the surface of the wafer 300. A distance 310 separates the heated plate 220 from the wafer 300. In an embodiment, the distance 310 is in a range from about 5 millimeter (mm) to about 30 mm.

The heated plate 220 has a high temperature to ensure that the chemical solution on the wafer 300 remains hot. In an embodiment, the heated plate 220 has a temperature that is in a range from about 150 degrees Celsius to about 400 degrees Celsius, and the chemical solution on the surface of the wafer has a temperature that is in a range from about 120 degrees Celsius to about 180 degrees Celsius. Without the heated plate 220, the chemical solution may be sufficiently hot coming out of the heating component 210, but may cool off rapidly as it is coated onto the surface of the wafer 300.

Further, without the heated plate 220, the chemical solution overlying the outer regions of the wafer 300 may be substantially cooler than the chemical solution overlying the center region of the wafer 300. This temperature non-uniformity leads to etching non-uniformity, meaning that the center region of the wafer 300 may be etched at a faster rate than the outer regions of the wafer 300. In the present embodiment, the etching non-uniformity problem is resolved because the heated plate 220 helps maintain a stable and hot temperature throughout the surface of the wafer 300.

As discussed above, the silicon nitride etching process performed using the chemical solution generates silica precipitate particles, ammonia gas (which evaporates), and phosphoric acid. Thus, as the chemical reaction continues to take place, the number of silica precipitate particles increases in the chemical solution, which makes the chemical solution "dirtier." The "dirty" chemical solution—which is the chemical solution that has already been used to etch the silicon nitride from the wafer 300—is collected by the recycle tank component 230. This recycled chemical solution is sent to the cooling component 240 to be cooled.

The cooled chemical solution is then sent to the regeneration component 250. The regeneration component 250 is communicatively coupled with the monitoring component 260. The monitoring component 260 has a sensor that detects and measures a silicon concentration level in the chemical solution in the regeneration component 250. If the measured silicon concentration level is within a predefined range, for example within the range corresponding to the region 120 of the chart 50 (shown in FIG. 2), that indicates the silicon concentration level is acceptable, and nothing needs to be changed. However, if the measured silicon concentration level is outside the predefined range, then the monitoring component 260 will instruct the regeneration component 250 to adjust the silicon concentration level in the chemical solution so as to bring it back to within the predefined range.

For example, if the measured silicon concentration level is too high, the regeneration component may add additional amounts of chemical solution to what is already in there. The additional chemical solution contains clean phosphoric acid and water, thereby diluting the chemical solution already in the regeneration component. Since the added chemical solution does not contain any silica precipitate particles, the overall silicon content is lowered for the diluted chemical solution.

The chemical solution is then sent to the filtration component 270 to filter out large contaminant particles in the incoming chemical solution. The filtration component 270 can also remove a portion of the silica precipitate particles. Thereafter, the chemical solution is sent to the chemical tank component 280. The chemical tank component 280 is also communicatively coupled with the monitoring component 260. Depending on the feedback from the monitoring component, additional clean chemical solution containing phosphoric acid and water can also be added to the chemical tank 280 to further lower the silicon concentration level in the chemical solution. It is understood that in some embodiments, the chemical tank component 280 and the regeneration component 250 may be integrated into a single unit.

The chemical solution then leaves the chemical tank component 280 and is filtered again by the filtration component 285. The filtration component 285 helps remove intrinsic particles in the incoming chemical solution. Additionally, the filtration component 285 may help remove some of the silica precipitate particles. Thereafter, the chemical solution goes through a pump component 290, which propels the chemical solution in an intended direction towards the heating component 210. The chemical solution is then heated by the heating component 210 and applied to the wafer 300 again, thus completing the loop.

In an embodiment, the loop is performed in a chamber. It is understood that the components of the system 200 may simultaneously serve a plurality of additional chambers 350 as well. For example, the recycle tank component 230 and the chemical tank component 280 may be coupled to the additional chambers 350, where other wafers similar to the wafer 300 are being etched using loops similar to the one illustrated herein.

The system 200 offers advantages in etching the silicon nitride material from a wafer compared to traditional systems. It is understood, however, that other embodiments may offer different advantages, and that no particular advantage is required for any embodiment. One advantage is that through the heated plate 220, the system 200 helps maintain the temperature of the chemical solution on the wafer 300 within a stable and relatively uniform range, thereby improving etching uniformity. In comparison, wafers etched by traditional systems may suffer from temperature non-uniformity and thus etching non-uniformity issues.

Another advantage offered by the system 200 is that it keeps the silicon concentration level within a stable and specified range. Using the regeneration component 250, the monitoring component 260, and the (optional) chemical tank component 280, the system 200 can detect when the silicon concentration level is too high. When that occurs, additional clean chemical solution is supplied to dilute the chemical solution, thereby bringing down the silicon concentration level to be within the desired range. As such, the system 200 ensures that a proper balance is reached between reduced wafer surface defects and high etching selectivity. In comparison, traditional systems may suffer from insufficient etching selectivity, or an unacceptably high number of wafer surface defects.

One of the broader forms of the present disclosure involves a method. The method includes: monitoring a silicon concentration level in a chemical solution; adjusting the silicon concentration level in response to the monitoring; heating the chemical solution; applying the heated chemical solution to a wafer surface in a manner so that a temperature of the heated chemical solution is within a predefined temperature range throughout the wafer surface; and etching a nitride material of the wafer using the heated chemical solution.

Another of the broader forms of the present disclosure involves a method. The method includes: etching a nitride material on a wafer by using a chemical solution that is heated in part by placing a heated plate over the wafer; thereafter recycling the chemical solution; measuring a silicon concentration level within the recycled chemical solution; diluting the recycled chemical solution if the measured silicon concentration level is above a predetermined threshold; and repeating the etching using the recycled chemical solution.

Still another of the broader forms of the present disclosure involves a system. The system includes: a dispensing component that dispenses a chemical solution on a wafer to etch a nitride material therein; a heated component that is placed in proximity to the wafer, the heated component being operable to maintain a predetermined temperature range for the chemical solution throughout the wafer; a monitoring component that detects a silicon concentration level in a portion of the chemical solution after the chemical solution has been used to etch the nitride material; and a regenerating component that adjusts the silicon concentration level in the chemical solution in response to the silicon concentration level detected by the monitoring component.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
monitoring a silicon concentration level in a chemical solution;
adjusting the silicon concentration level in response to the monitoring;
heating the chemical solution;
applying the heated chemical solution to a wafer surface in a manner so that a temperature of the heated chemical solution is within a predefined temperature range throughout the wafer surface, wherein the applying the heated chemical solution includes placing a heated apparatus over the wafer surface and coating the heated chemical solution throughout the wafer surface, and wherein the heated apparatus includes a heated plate; and
etching a nitride material of the wafer using the heated chemical solution.

2. The method of claim 1, wherein the heated plate has a temperature that is in a range from about 150 degrees Celsius to about 400 degrees Celsius.

3. The method of claim 1, wherein the heated plate is spaced apart from the wafer surface by a distance that is in a range from about 5 millimeter (mm) to about 30 mm.

4. The method of claim 1, wherein the predefined temperature range is from about 120 degrees Celsius to about 180 degrees Celsius.

5. The method of claim 1, wherein the monitoring and the adjusting are carried out in a manner so that the silicon concentration level in the chemical solution remains within a predefined concentration level range.

6. The method of claim 5, wherein the adjusting includes: if the monitoring indicates that the silicon concentration level in the chemical solution is above the predefined concentration level range, reducing the silicon concentration level.

7. The method of claim 6, wherein the chemical solution includes a phosphoric acid; and wherein the reducing the silicon concentration level includes: adding additional phosphoric acid to the chemical solution.

8. The method of claim 1, further including:
recycling a portion of the heated chemical solution;
cooling the recycled portion of the chemical solution, wherein the monitoring is carried out using the cooled recycled portion of the chemical solution;
filtering contaminant particles out of the cooled portion of the chemical solution;
heating the filtered portion of the chemical solution; and
applying the heated filtered portion of the chemical solution to the wafer surface.

9. A method, comprising:
etching a nitride material on a wafer by using a chemical solution that is heated in part by placing a heated plate over the wafer;
thereafter recycling the chemical solution;
measuring a silicon concentration level within the recycled chemical solution;
diluting the recycled chemical solution if the measured silicon concentration level is above a predetermined threshold; and
repeating the etching using the recycled chemical solution.

10. The method of claim 9, wherein the repeating the etching is carried out using the diluted and recycled chemical solution.

11. The method of claim 9, wherein the diluting includes: adding additional chemical solution to the recycled chemical solution.

12. The method of claim 9, wherein the chemical solution includes phosphoric acid.

13. The method of claim 9, wherein the heated plate is spaced apart from the wafer by a distance that is in a range between about 5 millimeter (mm) and about 30 mm and has a temperature that is in a range between about 150 degrees Celsius and about 400 degrees Celsius.

14. The method of claim 9, wherein the etching includes: using the heated plate to heat the chemical solution to a temperature that is in a range between about 120 degrees Celsius and about 180 degrees Celsius throughout an entire surface of the wafer.

15. A system, comprising:
a dispensing component that dispenses a chemical solution on a wafer to etch a nitride material therein;
a heated component that is placed in proximity to and over a surface of the wafer, the heated component being operable to maintain a first predetermined temperature range for the chemical solution throughout the surface of the wafer, wherein the heated component includes a heated plate that is heated to a second predetermined temperature range;
a monitoring component that detects a silicon concentration level in a portion of the chemical solution after the chemical solution has been used to etch the nitride material; and
a regenerating component that adjusts the silicon concentration level in the chemical solution in response to the silicon concentration level detected by the monitoring component.

16. The system of claim 15, wherein:
the chemical solution includes a phosphoric acid; and
the regenerating component adds additional phosphoric acid to the chemical solution if the silicon concentration level detected by the monitoring component is outside of a predetermined concentration level range.

17. The system of claim 15, wherein the first predetermined temperature range is from about 120 degrees Celsius to about 180 degrees Celsius.

18. The system of claim 15, wherein:
the heated plate is placed about 5 millimeter (mm) to about 30 mm over the surface of the wafer; and
the second predetermined temperature range from about 150 degrees Celsius to about 400 degrees Celsius.

19. The system of claim 15, further including:
a recycling component that collects the chemical solution after the chemical solution has been used to etch the nitride material, wherein the chemical solution used by the monitoring component to detect the silicon concentration level therein is collected from the recycling component;
a filtering component that filters out contaminant particles from the chemical solution; and
a pump to propel the chemical solution to flow towards the dispensing component.

* * * * *